United States Patent
Alonso et al.

(10) Patent No.: US 9,917,266 B2
(45) Date of Patent: Mar. 13, 2018

(54) BENDABLE DEVICE WITH A WINDOW TOP LAYER AND A BODY HAVING EXTENDABLE BENDING REGION

(71) Applicant: Microsoft Technology Licensing, LLC, Redmond, WA (US)

(72) Inventors: Vicente Calvo Alonso, Kaarina (FI); Mikael Kontkanen, Lieto (FI); Esa Määttä, Espoo (FI); Ilpo Kauhaniemi, Vantaa (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 7 days.

(21) Appl. No.: 14/827,540

(22) Filed: Aug. 17, 2015

(65) Prior Publication Data
US 2017/0054105 A1    Feb. 23, 2017

(51) Int. Cl.
*H01L 51/00*    (2006.01)
*G06F 1/16*    (2006.01)
(Continued)

(52) U.S. Cl.
CPC ........ *H01L 51/0097* (2013.01); *G02B 5/3033* (2013.01); *G06F 1/1601* (2013.01); *G06F 1/163* (2013.01); *G06F 1/1652* (2013.01); *G06F 1/1656* (2013.01); *G06F 1/1675* (2013.01); *H01L 27/323* (2013.01); *H01L 51/5246* (2013.01); *H01L 51/5253* (2013.01); *H01L 51/5293* (2013.01); *H01L 51/56* (2013.01); *G06F 2203/04102* (2013.01); *G06F 2203/04103* (2013.01); *H04M 1/0268* (2013.01)

(58) Field of Classification Search
CPC . H01L 51/5253; H01L 51/56; H01L 51/5293; H01L 27/323; H01L 51/0097; H01L 51/5246; G02B 5/3033; G06F 1/1601; G06F 1/1652
See application file for complete search history.

(56) References Cited

U.S. PATENT DOCUMENTS

| 8,711,566 B2 | 4/2014 | O'Brien |
| 8,723,824 B2 | 5/2014 | Myers et al. |

(Continued)

FOREIGN PATENT DOCUMENTS

| CN | 103501383 A | 1/2014 |
| WO | 2014057241 A1 | 4/2014 |

OTHER PUBLICATIONS

"Eyes-On: Samsung's Youm Flexible Display Tech at CES 2013", Published on: Jan. 31, 2013, Available at: http://www.technobooklet.com/eyes-on-samsungs-youm-flexible-display-tech-at-ces-2013/.

(Continued)

*Primary Examiner* — Michael Jung

(57) ABSTRACT

A bendable device is provided. The device comprises: a display stack which comprises a window layer and at least one active layer, and a body which comprises an extendable bending region. The active layers are fixed to the window layer at the bottom side of the window layer. Edges of the window layer extend outwards in relation to the at least one active layer at two or more sides of the display stack, and the window layer is rigidly fixed to the body at the edges which extend outwards at the bottom side of the window layer. A method for assembling a bendable device comprising a display is disclosed.

20 Claims, 2 Drawing Sheets

(51) Int. Cl.
*G02B 5/30* (2006.01)
*H01L 27/32* (2006.01)
*H01L 51/52* (2006.01)
*H01L 51/56* (2006.01)
*H04M 1/02* (2006.01)

(56) References Cited

U.S. PATENT DOCUMENTS

| | | | |
|---|---|---|---|
| 8,787,016 B2 | 7/2014 | Rothkopf et al. | |
| 8,804,324 B2 | 8/2014 | Bohn et al. | |
| 8,804,349 B2 | 8/2014 | Lee et al. | |
| 8,873,225 B2 | 10/2014 | Huitema et al. | |
| 9,081,540 B1* | 7/2015 | Cho | G06F 1/1601 |
| 9,256,308 B2* | 2/2016 | Aoki | G06F 3/041 |
| 2003/0118179 A1* | 6/2003 | Barnett | H04M 1/0216 |
| | | | 379/428.01 |
| 2006/0050169 A1 | 3/2006 | Misawa | |
| 2013/0083496 A1 | 4/2013 | Franklin et al. | |
| 2014/0092342 A1* | 4/2014 | Franklin | G02B 6/0088 |
| | | | 349/62 |
| 2014/0168880 A1 | 6/2014 | Saila et al. | |
| 2014/0240985 A1 | 8/2014 | Kim et al. | |
| 2014/0267950 A1 | 9/2014 | Kang et al. | |
| 2014/0295150 A1 | 10/2014 | Bower et al. | |
| 2014/0354558 A1 | 12/2014 | Cho et al. | |
| 2015/0055286 A1* | 2/2015 | Eguchi | G06F 1/1652 |
| | | | 361/679.26 |
| 2015/0145804 A1* | 5/2015 | Ma | G06F 3/044 |
| | | | 345/174 |
| 2015/0227172 A1 | 8/2015 | Namkung et al. | |
| 2015/0346776 A1* | 12/2015 | Miyake | G06F 1/1652 |
| | | | 345/174 |
| 2016/0062412 A1* | 3/2016 | Park | G06F 1/1616 |
| | | | 361/679.27 |
| 2016/0101609 A1* | 4/2016 | Liu | B32B 37/12 |
| | | | 156/275.5 |
| 2016/0136927 A1* | 5/2016 | Shin | B32B 7/12 |
| | | | 428/304.4 |

OTHER PUBLICATIONS

Merrill, Scott, "Sony Flexible OLED Display on Display at CEATEC", Published on: Oct. 7, 2009, Available at: http://techcrunch.com/2009/10/07/sony-flexible-oled-display-on-display-at-ceatec/.

"International Search Report and Written Opinion Issued in PCT Application No. PCT/US2016/042703", dated Jan. 19, 2017, 12 Pages.

"Second Written Opinion Issued in PCT Application No. PCT/US2016/042703", dated Jul. 12, 2017, 6 Pages.

"International Preliminary Report on Patentability Issued in PCT Application No. PCT/US2016/042703", dated Nov. 9, 2017, 7 pages.

* cited by examiner

BENDABLE DEVICE WITH A WINDOW TOP LAYER AND A BODY HAVING EXTENDABLE BENDING REGION

BACKGROUND

Technology of bendable multilayer electronic devices is becoming increasingly relevant in flexible displays and touch surfaces. Many customer electronics manufacturers are applying the bendable technology to handheld devices, laptops, wearable devices, and other consumer electronics. Integration of bendable or flexible layers with the rest of the device has an influence on the stresses that appears between the different layers, and how those are transmitted through the device.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present embodiments and is not intended to represent the only forms in which the present invention may be constructed or utilized. However, the same or equivalent functions and sequences may be accomplished by different embodiments.

The embodiments described below are not limited to implementations which solve any or all of the disadvantages of known devices and covers. Although the present examples are described and illustrated herein as being implemented with a few layers connected to a body, the devices described are provided as an example and not a limitation. As those skilled in the art will appreciate, the presented embodiments are suitable for application in a variety of bendable devices comprising multiple stacks of layers, and the individual elements can be a schematic representation of various parts of a device, such as a display or a touch screen. These parts may comprise a plurality of different layers and other elements in between the body and the display stack.

In bendable or flexible electronic devices, such as FOLED (Flexible Organic Light Emitting Diode) devices, the display part of the device has to be attached to the main body in a way that does not prevent or resist bending of the device.

Figure 1:
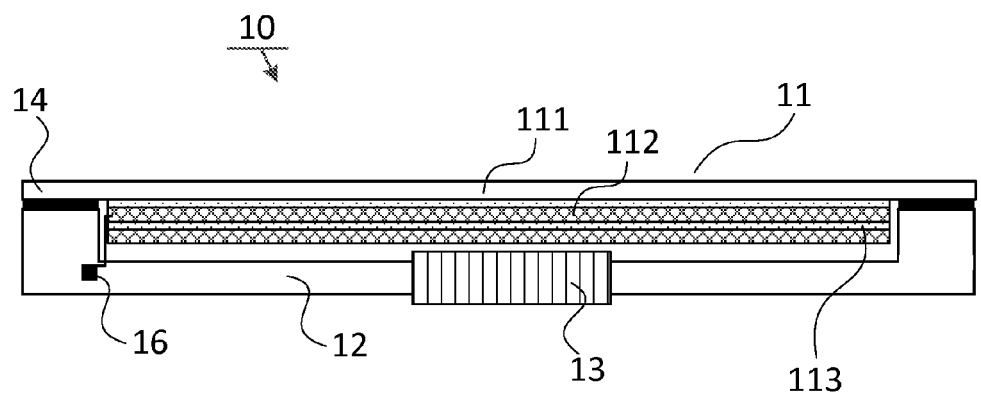
FIG. 1 is a schematic side view of a device according to an embodiment.

FIG. 1 shows a bendable device 10 according to an embodiment. The device 10 may be a bendable electronic device. This Figure is a side cross-section view of the device 10. The device 10 comprises a display stack 11 which comprises a window layer 111 and at least one active layer 112 (FIG. 1 shows two active layers 112 as an example only); and a body portion 12 with an extendable bending region 13. The window layer 111 is the top layer of the display stack 11, and the rest of the stack is attached to it at the bottom side. Edges 14 of the window layer 111 extend outwards in relation to the at least one active layer 112 at two or more sides of the display stack 11. In FIG. 1, the cross-section side view is chosen such that the window layer 111 extends outwards on both sides of the display stack—left and right on the Figure. At the edges 14 which extend outwards the window layer 111 is rigidly fixed to the body 12, at the bottom side of the window layer 111. This is schematically illustrated in FIG. 1 by black colored stripes, indicating a rigid fixation e.g. by an adhesive. This makes the window layer 111 the main driving element for the bending, so that the neutral plane of bending for the whole device is on the bottom of the window layer 111.

The terms 'top' and 'bottom' are used for clarity and relate to the positioning on the figures only. The top window layer 111 may be positioned on any side of the device 10.

The active layers 112 may comprise an active display layer and an active touch sensing layer, for example if the device 10 is a bendable touch screen device. One of the layers of the display stack 11 may also be a polarizing layer, for example if the display stack is an LCD (Liquid Crystal Display) stack. The display stack 11 may also comprise a display support sheet. In an embodiment, layers of the display stack 11 are fixed to each other and to the window layer 111 by an optically clear adhesive 113, such as LOCA (liquid optically clear adhesive). Layers of the display stack 11 are thereby laminated to each other with a transparent adhesive.

The term 'bendable' herein includes both a bending radius that is large with respect to the display thickness and also small with respect to the display thickness. For example, bendable displays include displays that are 3 mm thin and have may operate in a bent form in which the bend radius is 5 cm or less than 1 mm. In the latter bend radius of less than 1 mm, the display may be described as foldable, similar to a folded sheet of paper. Furthermore, 'bendable' refers to dynamic bending, and includes both elastic and inelastic plasticity. Embodiments of the device 10 can apply to display devices as well as any other devices which include displays. The display may be, for example, a flexible organic light emitting diode (OLED) display, an LCD or an electronic paper display.

The body 12 of the device 10 may comprise elements required for operation of the device 10. For example, if the device 10 is an electronic device, the body 12 of the device may comprise elements such as a controller, a processing unit, and a memory.

The body also comprises an extendable bending region 13. In the embodiment shown on FIG. 1, this region 13 is illustrated as a hinge. The hinge may be a saw tooth shaped hinge, or a hinge comprising a plurality of vertical elements that can freely move apart and together. In an embodiment, movement of the extendable bending region 13 follows the bending of the device so that the bottom part of the region 13 extends further than the top part. In alternative embodiments, the extendable bending region 13 may be an elastic component. For example, the elastic component may be a rubber component which is extendable further on the bottom than the top.

The extendable bending region 13 may have any width or shape. In an embodiment, this region may span across the body 12 of the device 10. The body 12 may also comprise more than one extendable region 13, for example if the device 10 is bendable about more than one axis.

According to an embodiment, the active layers 112 of the display stack 11 are separated from the body by a space, and the space is filled with nonadhesive material. For example, the space can be filled with shock absorbing material. This can provide an effect of improved resistance against any pressure on the screen, and provide a tactile response for a user pressing on the window. Alternatively, the space may be filled with air. The body 12 is shaped in such a way that it is only rigidly attached to the display at the edges 14 of the window layer 111. In an embodiment, the body 12 may be in a sliding connection with the bottom active layer 112.

According to an embodiment, the display stack 11 has an electric connection with the body 12, schematically illustrated by a box with a wire 16. The electric connection can be implemented as a flexible connector, for example via a flexible printed circuit (FPC), to the hardware of the device 10 located in the body 12. In an embodiment shown on FIG. 1, the connection 16 is made with one of the active layers 112 of the display stack. The body 12 may have an opening which allows the flexible connector to extend through the opening into the space between the display stack 11 and the body 12, and move within that space when the device 10 is bent.

In an embodiment, the device 10 is operable in at least two states: a first "unbent" state and a second "bent" state. In the first state the display stack 11 and the body 12 are substantially flat, and the extendable bending region 13 of the body is unextended. In the second state the display stack 11 and the body 12 are bent and the extendable bending region 13 of the body is extended. The inner bending curvature of the device is on the top side of the window layer, so when the device 10 is bent it bends upwards in relation to the window layer 111, as shown schematically on FIG. 2 by dashed lines and arrows. The dashed horizontal line shows the neutral axis of bending when the window layer 111 is attached to the body 12 according to embodiments of the present invention.

Figure 2:
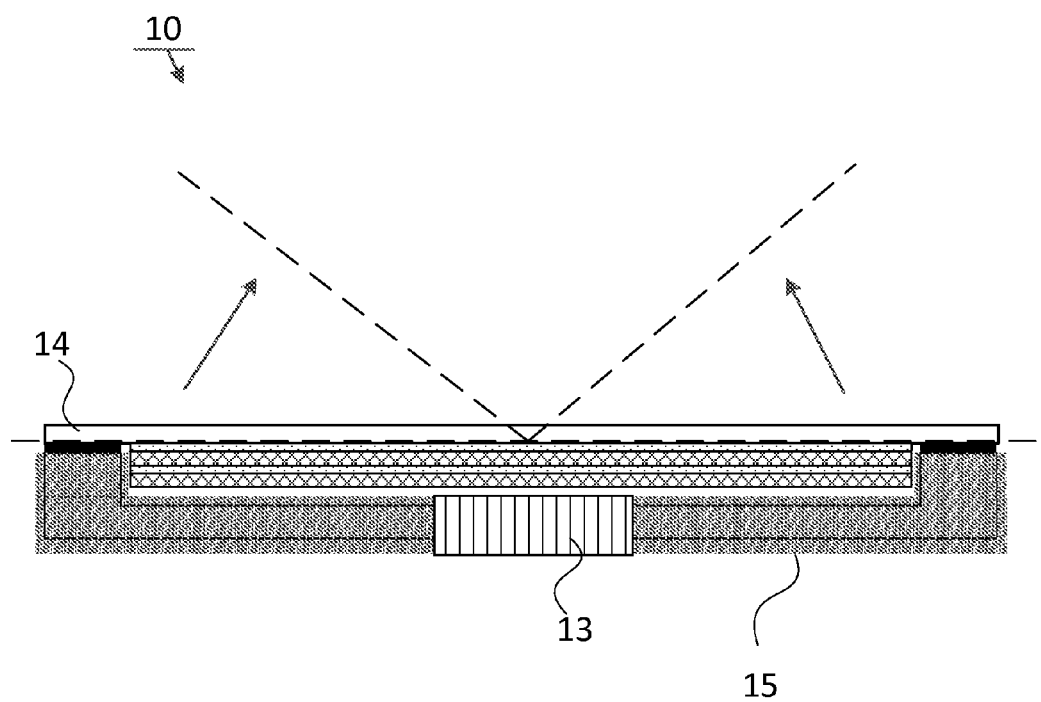
FIG. 2 is a schematic side view of a device with a casing according to an embodiment.

FIG. 2 illustrates an embodiment wherein the body 12 comprises a casing 15. In this embodiment the casing 15 comprises the bending region 13 of the body, and the window layer 111 is rigidly fixed to the casing 15 at the edges which extend outside the at least one active layer 112. The casing 15 also encloses the body 12, the at least one active layer 112 and the bottom side of the window layer 111.

The casing 15 may be a plastic or a metal casing which encloses most parts of the device, on one side sealed by the window layer 111, and prevents external contact with internal elements of the device 10 comprised in the body 12.

In an embodiment, the display stack 11 and the body 12 are bendable at least 20 degrees. If, for example, the device 10 is a foldable device, the display stack 11 and the body 12 are bendable more than 90 degrees.

According to an embodiment, the device 10 is bendable about at least one axis which lies in the same plane as the window layer 111 in the first state of the device 10. The device 10 may be, for example, bendable or foldable about one or two axes which lie in the plane of the window layer 111 when the device is unbent.

In an embodiment, the window layer comprises a viscoelastic material. This material may be selected from polyethylene terephthalate (PET) and polyimide (PI). These materials can resist damage and external stresses while maintaining transparency and flexibility.

In an embodiment, thickness of the display stack may be between 0.1 and 0.5 and millimeters.

The device 10 according to any of the above embodiments may be implemented as a portable electronic device, for example a mobile phone, smart watch, tablet or laptop.

When the device 10 is bent, the layers may move or experience tension in relation to each other. The movement distance and tension can depend on thickness of each layer, number of layers, bending angle and the adhesion between the layers. According to the embodiments described above, layers of the display stack are fixed to each other, but only attached to the body of the device comprising a bending area via the window layer edges. This makes the window layer the main driving element for the bending, so that the neutral plane of bending for the whole device is on the bottom of the window. This can provide a technical effect that the display stack does not buckle or delaminate when the device is bent upwards, because the window layer is the only layer which compresses during bending, and the other layers extend due to the neutral axis being above them. The body of the device can extend freely due to the extending element.

Layers of the display stack may be laminated to each other by optically clear adhesives which can be elastic. Due to elasticity, these adhesives can be more efficient in extension rather than in compression. This may have an effect of absorbing a portion of stress, and to avoid buckling between layers.

The window layer can be rigidly fixed to the body to creating an airtight closed assembly that can provide effective protection against dust and water. A further technical effect can be decreased exposure of internal elements and active layers to external forces. Another effect may be an implementation with seamless design, with no visible separation lines on the front surface of the final product.

Devices according to any of the above embodiments can be used in flexible electronic devices such as wearable devices wrapping around e.g. user's wrist, foldable laptop computers where the display extends over the hinge portion and flexible e-reader display devices. The devices may be embedded in or attached to a bendable or foldable electronic system.

Figure 3:
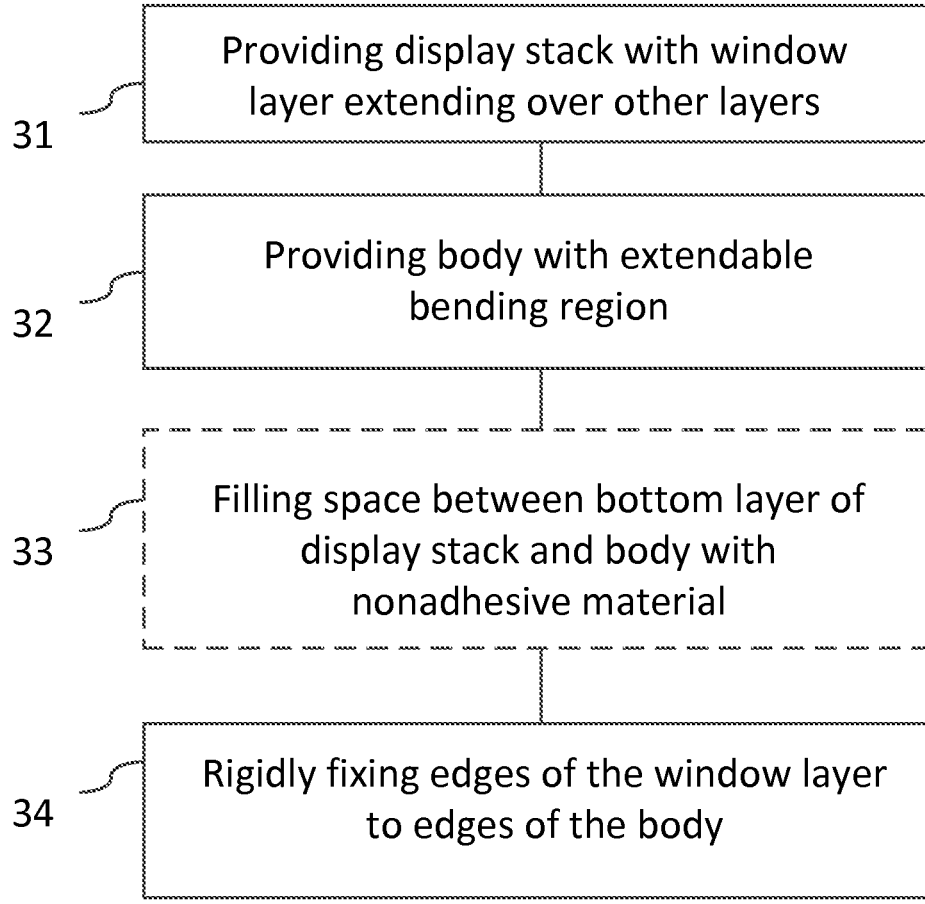
FIG. 3 is a flow chart showing a method according to an embodiment.

FIG. 3 illustrates a method for assembling a bendable display device according to an aspect. The method comprises providing 31 a display stack which comprises a window layer and at least one active layer, wherein edges of the window layer extend outwards in relation to the at least one active layer at two or more sides of the display stack. A body which comprises an extendable bending region is also provided at 32. The method further comprises rigidly fixing 34 the display stack to the body by adhering the edges of the window layer to edges of the body. The rigid fixing 34 may be achieved by applying adhesives such as pressure sensitive adhesives epoxies and ultraviolet cured adhesives. The fixing 34 can also be achieved by ultrasonic welding. Use of these materials can provide an effect of strong adhesion on a relatively small bonding area. In an embodiment, the method optionally comprises filling 33 a space between the bottom layer of the display stack and the body by a nonadhesive material, for example with shock absorbing nonadhesive material, or a sliding material to provide a sliding connection. Alternatively, the space may be filled with air and no connection made between these elements. According to an embodiment, the method may also comprise evacuating the air from the device before fixing 34 the display stack to the body of the device.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

The methods described herein may be performed by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible storage media include computer storage devices comprising computer-readable media such as disks, thumb drives, memory etc. and do not include propagated signals. Propagated signals may be present in a tangible storage media, but propagated signals per se are not examples of tangible storage media. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

According to an aspect, a bendable device is disclosed. The device comprises: a display stack which comprises a window layer and at least one active layer, and a body which comprises an extendable bending region. The at least one active layer is fixed to the window layer at the bottom side of the window layer, edges of the window layer extend outwards in relation to the at least one active layer at two or more sides of the display stack, and the window layer is rigidly fixed to the body at the edges which extend outwards at the bottom side of the window layer.

In an embodiment, the layers of the display stack are fixed to each other by an optically clear adhesive.

In an embodiment, alternatively or in addition to the above embodiments, the body comprises a casing, the casing comprises the extendable bending region of the body, the window layer is rigidly fixed to the casing at the edges which extend outwards, and the casing encloses the body, the at least one active layer and the bottom side of the window layer.

In an embodiment, alternatively or in addition to the above embodiments, the at least one active layer is separated from the body by a space, and said space is filled with nonadhesive material.

In an embodiment, in addition to the above embodiment, the at least one active layer of the display stack is in a sliding connection with the body.

In an embodiment, alternatively or in addition to the above embodiments, the extendable bending region of the body is a hinge.

In an embodiment, alternatively to the above embodiment, the extendable bending region of the body is an elastic component.

In an embodiment, alternatively or in addition to the above embodiments, the device is operable in at least two states including: a first state in which the display stack and the body are substantially flat, and the extendable bending region of the body is unextended, and a second state in which the display stack and the body are bent. In the second state the inner bending curvature of the device is on the top side of the window layer, and the extendable bending region of the body is extended.

In an embodiment, in addition to the above embodiment, the device is bendable about at least one axis which lies in the same plane as the window layer in the first state of the device.

In an embodiment, in addition to the above embodiment, the display stack and the body are bendable at least 20 degrees. In an embodiment, the display stack and the body are bendable more than 90 degrees.

In an embodiment, alternatively or in addition to the above embodiments, the display stack comprises an active display layer and an active touch sensing layer.

In an embodiment, alternatively or in addition to the above embodiments, the active display layer comprises a flexible organic light-emitting diode display. In an embodiment, the display stack further comprises a polarizing layer.

In an embodiment, alternatively or in addition to the above embodiments, the window layer comprises a viscoelastic material selected from the group of: polyethylene terephthalate and polyimide.

In an embodiment, alternatively or in addition to the above embodiments, the window layer is rigidly fixed to the body by an adhesive selected from the group of: pressure sensitive adhesive, epoxy, and ultraviolet cured adhesive.

In an embodiment, alternatively or in addition to the above embodiments, the device is implemented as a portable electronic device.

According to an aspect, a method for assembling a bendable device comprising a display is disclosed. The method comprises: providing a display stack which comprises a window layer and at least one active layer, wherein edges of the window layer extend outwards in relation to the at least one active layer at two or more sides of the display stack; providing a body which comprises an extendable bending region; rigidly fixing the display stack to the body by adhering the edges of the window layer to edges of the body.

In an embodiment, the method further comprises filling a space between the at least one active layer of the display stack and the body by a nonadhesive material.

According to an aspect, a bendable portable electronic device is disclosed. The device comprises: a display stack which comprises a top window layer, a display layer, a touch sensing layer and a polarizing layer; and a body which comprises a casing comprising an extendable hinge. The layers of the display stack are fixed each other by an optically clear adhesive and positioned below the top window layer, edges of the top window layer extend outwards in relation to the other layers of the display stack at each side of the display stack, and the window layer is rigidly fixed to the casing at the extending edges at the bottom side of the window layer.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the technical effects described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The term 'comprising' is used herein to mean including the method blocks or elements identified, but that such blocks or elements do not comprise an exclusive list and a method or device may contain additional blocks or elements.

It will be understood that the above description is given by way of example only and that various modifications may be made by those skilled in the art. The above specification, embodiments and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A bendable device comprising:
a display stack comprising a window layer and at least one active layer, and
a body positioned under the display stack and comprising a casing, the body that includes an extendable bending region configured for extending in one direction and bending in another direction along a single axis to allow the display stack to bend,
wherein:
the at least one active layer is fixed to the window layer at a bottom side of the window layer,
edges of the window layer extend outwards in relation to the at least one active layer at two or more sides of the display stack,
the window layer is fixed to the body at edges, wherein the body extends outward,
the casing encloses the body, the at least one active layer, and the bottom side of the window layer,
the extendable bending region comprises a different material than the casing.

2. The device of claim 1, wherein the at least one active layer is one of a plurality of layers of the display stack that are fixed to each other by an optically clear adhesive.

3. The device of claim 1, further comprising a space filled with nonadhesive material between the at least one active layer of the display stack and the body.

4. The device of claim 1, wherein: the at least one active layer is separated from the body by a space, and said space is filled with nonadhesive material.

5. The device of claim 1, wherein the extendable bending region of the body is a hinge.

6. The device of claim 1, wherein the extendable bending region of the body is an elastic component.

7. The device of claim 1, operable in at least two states including:
a first state in which the display stack and the body are substantially flat, and the extendable bending region of the body is unextended,
a second state in which the display stack and the body are bent,
wherein in the bent state the inner bending curvature of the device is on the top side of the window layer.

8. The device of claim 7, wherein the device is bendable about at least one axis which lies in a same plane as the window layer in the first state of the device.

9. The device of claim 8, wherein the display stack and the body are bendable at least 20 degrees.

10. The device of claim 1, wherein the display stack and the body are bendable more than 90 degrees.

11. The device of claim 1, wherein the display stack comprises an active display layer and an active touch sensing layer.

12. The device of claim 11, wherein the active display layer comprises a flexible organic light-emitting diode display.

13. The device of claim 11, wherein the display stack further comprises a polarizing layer.

14. The device of claim 1, wherein the window layer comprises a viscoelastic material selected from the group of: polyethylene terephthalate and polyimide.

15. The device of claim 1, wherein the window layer is fixed to the body by an adhesive selected from the group of: pressure sensitive adhesive, epoxy, and ultraviolet cured adhesive.

16. The device of claim 1 implemented as a portable electronic device.

17. A bendable electronic device, comprising:
a display stack comprising a window layer and at least one active layer, and
a body positioned under the display stack and comprising a casing, the body with an extendable bending region configured for extending in one direction and folding in another direction along a single axis to allow the display stack to bend,
wherein:
the at least one active layer is fixed to the window layer at a bottom side of the window layer,
edges of the window layer extend outwards in relation to the at least one active layer at two or more sides of the display stack,
the window layer is fixed to the body at peripheral edges, wherein the body extends outward,
the casing encloses the body, the at least one active layer, and the bottom side of the window layer,
the extendable bending region comprises a different material than the casing.

18. A bendable electronic device, comprising:
a display stack comprising a window layer and at least one active layer, and
a body positioned under the display stack and comprising a casing, the body with an extendable bending region configured for extending in one direction and folding in another direction along a single axis to allow the display stack to bend,
wherein:
the at least one active layer is fixed to the window layer at a bottom side of the window layer,
edges of the window layer extend outwards in relation to the at least one active layer at two or more sides of the display stack,
the window layer is fixed to the body at peripheral edges, wherein the body extends outward, the casing encloses the body, the at least one active layer, and the bottom side of the window layer,
the extendable bending region comprises a different material than the casing.

19. The bendable electronic device of claim 18, further comprising a space filled with nonadhesive material between the at least one active layer of the display stack and the body.

20. The bendable electronic device of claim 18, wherein the display stack further comprises a polarizing layer.

* * * * *